United States Patent
Kiyama et al.

(10) Patent No.: US 11,257,701 B2
(45) Date of Patent: Feb. 22, 2022

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Hidekazu Kiyama, Koshi (JP);
Takehiro Kadokura, Tokyo (JP);
Kazutoshi Ishimaru, Koshi (JP);
Takashige Suematsu, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/592,976

(22) Filed: Oct. 4, 2019

(65) Prior Publication Data
US 2020/0111693 A1 Apr. 9, 2020

(30) Foreign Application Priority Data
Oct. 5, 2018 (JP) .............................. JP2018-190293

(51) Int. Cl.
*H01L 21/677* (2006.01)
*B65G 47/90* (2006.01)
*H01L 21/687* (2006.01)
*H01L 21/67* (2006.01)

(52) U.S. Cl.
CPC ........ *H01L 21/67745* (2013.01); *B65G 47/90* (2013.01); *H01L 21/67259* (2013.01); *H01L 21/67742* (2013.01); *H01L 21/68707* (2013.01)

(58) Field of Classification Search
USPC ....................................................... 700/112
See application file for complete search history.

(56) References Cited

U.S. PATENT DOCUMENTS

| | | | | |
|---|---|---|---|---|
| 4,641,071 A | * | 2/1987 | Tazawa | G05B 19/232 318/561 |
| 2005/0016818 A1 | * | 1/2005 | Ito | B05B 13/0228 198/345.1 |
| 2007/0010898 A1 | * | 1/2007 | Hosek | G05B 19/4185 700/2 |
| 2011/0178626 A1 | * | 7/2011 | Kondoh | B25J 19/00 700/108 |
| 2015/0112503 A1 | * | 4/2015 | Matsumoto | G05D 23/19 700/299 |

FOREIGN PATENT DOCUMENTS

JP 2011-164542 A 8/2011

* cited by examiner

*Primary Examiner* — Emilio J Saavedra
(74) *Attorney, Agent, or Firm* — Pearne & Gordon LLP

(57) ABSTRACT

A substrate processing apparatus includes a transfer device configured to transfer at least one substrate as a processing target; a transfer controller configured to control the transfer device to perform a normal transfer of transferring the substrate and a high-accuracy transfer of transferring the substrate with higher positioning accuracy as compared to the normal transfer; a warm-up controller configured to control the transfer device to perform a warm-up operation, which is different from the normal transfer and the high-accuracy transfer, when necessary; and a necessity determination unit configured to make a determination that the warm-up operation is required as a beginning of the high-accuracy transfer is approaching when a duration of a stop state of the transfer device exceeds a preset reference time.

13 Claims, 13 Drawing Sheets

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2018-190293 filed on Oct. 5, 2018, the entire disclosures of which are incorporated herein by reference.

TECHNICAL FIELD

The various aspects and embodiments described herein pertain generally to a substrate processing apparatus, a substrate processing method and a recording medium.

BACKGROUND

Patent Document 1 describes a substrate processing apparatus including a substrate stage capable of holding a substrate at an exposure position, an irradiating device configured to irradiate light for pattern exposure to the substrate held at the exposure position of the substrate stage, and a controller configured to perform an idle operation of at least the substrate stage. In this substrate processing apparatus, by performing the idle operation when a transfer of a substrate as an exposure target onto the substrate stage is stopped, a temperature of the apparatus or the like is maintained within a preset range, and exposure accuracy can be stabilized.

Patent Document 1: Japanese Patent Laid-open Publication No. 2011-164542

SUMMARY

In one exemplary embodiment, a substrate processing apparatus includes a transfer device configured to transfer at least one substrate as a processing target; a transfer controller configured to control the transfer device to perform a normal transfer of transferring the substrate and a high-accuracy transfer of transferring the substrate with higher positioning accuracy as compared to the normal transfer; a warm-up controller configured to control the transfer device to perform a warm-up operation, which is different from the normal transfer and the high-accuracy transfer, when necessary; and a necessity determination unit configured to make a determination that the warm-up operation is required as a beginning of the high-accuracy transfer is approaching when a duration of a stop state of the transfer device exceeds a preset reference time.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
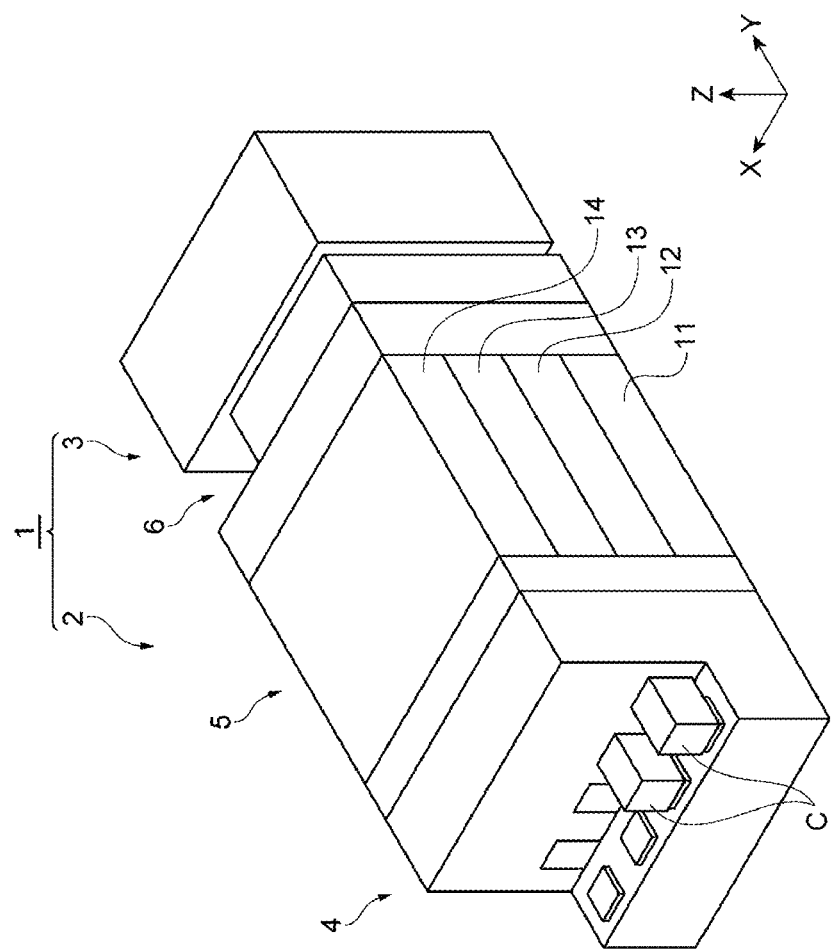
FIG. 1 is a schematic diagram illustrating an example configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the description, same parts or parts having same functions will be assigned same reference numerals, and redundant description will be omitted. In the following, in order to clarify positional relationships, the X-axis, Y-axis and Z-axis which are orthogonal to each other will be defined. The positive Z-axis direction will be regarded as a vertically upward direction.

[Substrate Processing System]

A substrate processing system 1 is a system configured to form a photoresist film on a substrate, expose the photosensitive film and develop the photosensitive film. The substrate as a processing target is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3, and then, perform a developing processing on the resist film after the exposure processing.

[Substrate Processing Apparatus]

Figure 2:
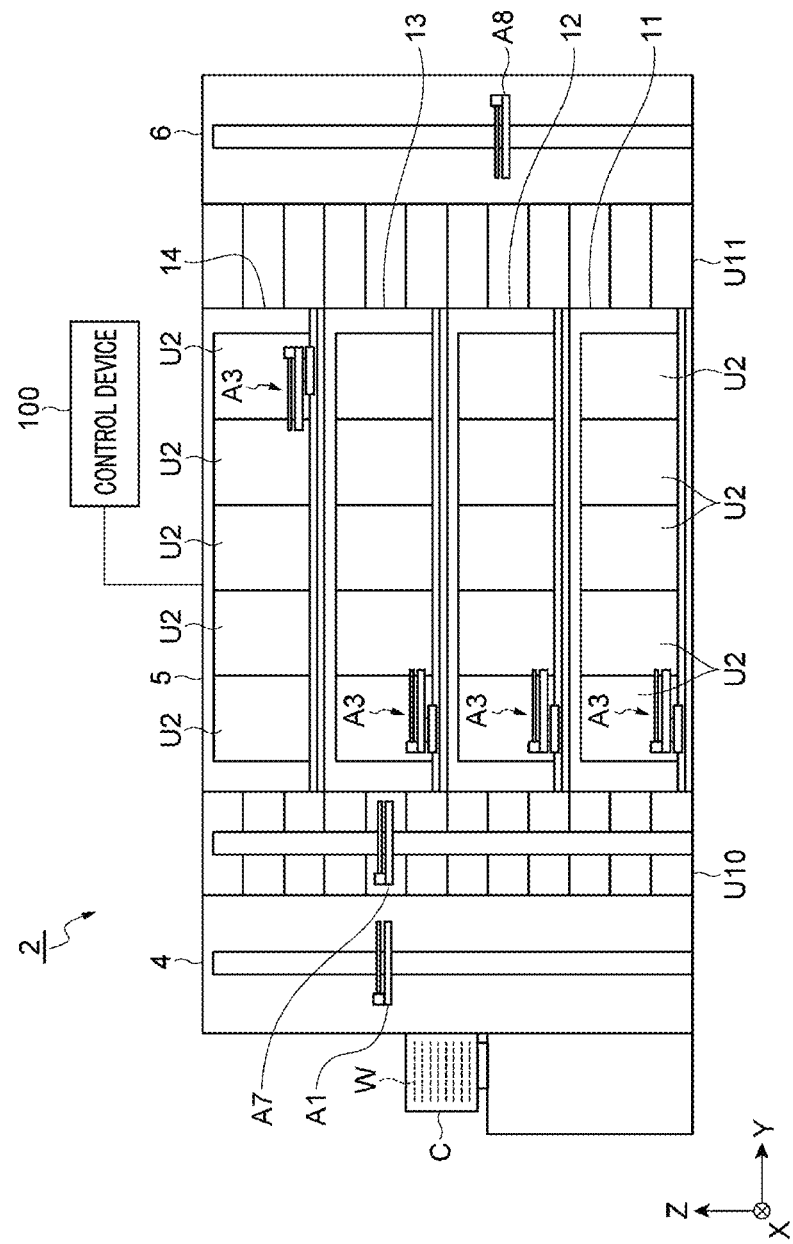
FIG. 2 is a schematic diagram illustrating an example configuration of a substrate processing apparatus.

Below, a configuration of the coating and developing apparatus 2 as an example of a substrate processing apparatus will be explained. As depicted in FIG. 1 and FIG. 2, the coating and developing apparatus 2 is equipped with a carrier block 4, a processing block 5, an interface block 6 and a control device 100.

The carrier block 4 is configured to carry a wafer W into/from the coating and developing apparatus 2. For example, the carrier block 4 is configured to support a plurality of carriers C for wafers W and incorporates therein a delivery device A1. Each carrier C accommodates therein, for example, a multiple number of circular wafers W. The delivery device A1 is configured to take out the wafer W from the carrier C, deliver the wafer W to the processing block 5, receive the wafer W from the processing block 5 and return the wafer W back into the carrier C.

Figure 3:
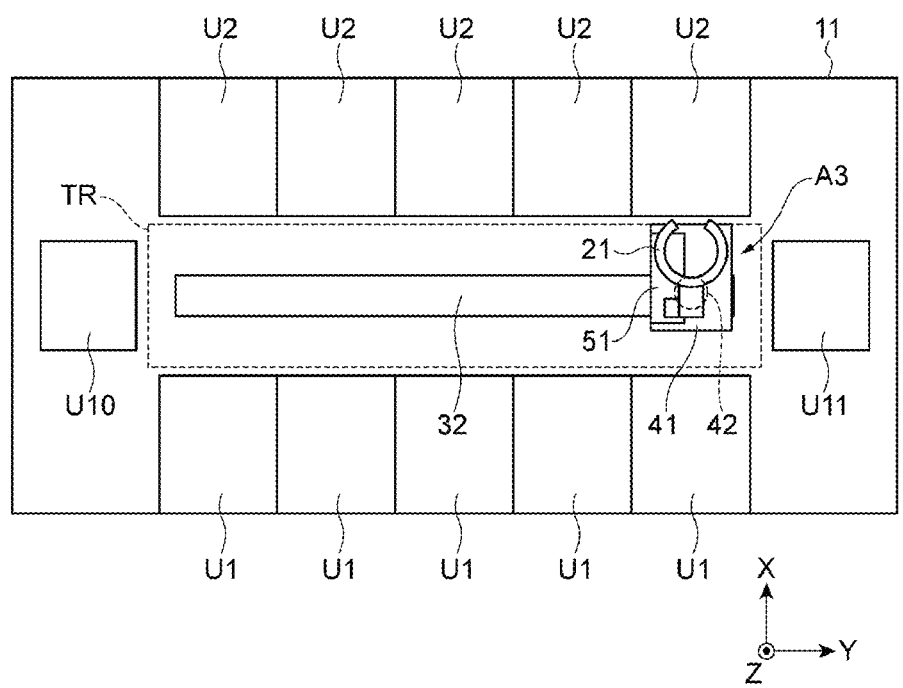
FIG. 3 is a schematic diagram illustrating an example of an internal configuration of a processing floor.

The processing block 5 includes multiple processing floors 11, 12, 13 and 14. As depicted in FIG. 2 and FIG. 3, each of the processing floors 11 to 14 incorporates therein a plurality of coating units U1 (processing modules), a plurality of heat treatment units U2 (processing modules) and a transfer device A3 configured to transfer wafers W into these units. The coating unit U1 is configured to coat a processing liquid on a surface of the wafer W. The heat treatment unit U2 incorporates, for example, a heating plate and a cooling plate, and is configured to perform a heat treatment by heating the wafer W with the heating plate and then cooling the heated wafer W with the cooling plate.

The processing floor 11 is configured to form a bottom film on the surface of the wafer W by the coating unit U1 and the heat treatment unit U2. The coating unit U1 of the processing floor 11 is configured to coat a processing liquid for forming the bottom film on the wafer W. The heat treatment unit U2 of the processing floor 11 is configured to perform various kinds of heat treatments required to form the bottom film.

The processing floor 12 is configured to form a resist film on the bottom film by the coating unit U1 and the heat treatment unit U2. The coating unit U1 of the processing floor 12 is configured to coat a processing liquid for forming the resist film on the bottom film. The heat treatment unit U2 of the processing floor 12 is configured to perform various kinds of heat treatments required to form the resist film.

The processing floor 13 is configured to form a top film on the resist film by the coating unit U1 and the heat treatment unit U2. The coating unit U1 of the processing floor 13 is configured to coat a liquid for forming the top film on the resist film. The heat treatment unit U2 of the processing floor 13 is configured to perform various kinds of heat treatments required to form the top film.

The processing floor 14 is configured to perform a developing processing on the resist film after being exposed by the coating unit U1 and the heat treatment unit U2. The coating unit U1 of the processing floor 14 is configured to perform the developing processing of the resist film by coating a developing liquid on the surface of the wafer W after being exposed, and then, by washing away the developing liquid with a rinse liquid. The heat treatment unit U2 of the processing floor 14 is configured to perform various kinds of heat treatments required to perform the developing processing. As specific examples of these heat treatments, there are a heat treatment before the developing processing (PEB: Post Exposure Bake), a heat treatment after the developing processing (PB: Post Bake), and so forth.

Within the processing block 5, a shelf unit U10 is provided near the carrier block 4. The shelf unit U10 is partitioned into a multiple number of cells arranged in the vertical direction. An elevating device A7 is provided near the shelf unit U10. The elevating device A7 is configured to move the wafer W up and down between the cells of the shelf unit U10.

Within the processing block 5, a shelf unit U11 is provided near the interface block 6. The shelf unit U11 is partitioned into multiple cells which are arranged in the vertical direction.

The interface block 6 is configured to deliver the wafer W into/from the exposure apparatus 3. By way of example, the interface block 6 incorporates a delivery device A8, and is connected to the exposure apparatus 3. The delivery device A8 is configured to deliver the wafer W placed in the shelf unit U11 to the exposure apparatus 3, and receives the wafer W from the exposure apparatus 3 to return the received wafer W back into the shelf unit U11.

The control device 100 controls the coating and developing apparatus 2 to perform a coating and developing processing according to the following sequence, for example. First, the control device 100 controls the delivery device A1 to transfer the wafer W within the carrier C to the shelf unit U10, and controls the elevating device A7 to place this wafer W in the cell for the processing floor 11.

Then, the control device 100 controls the transfer device A3 to transfer the wafer W in the shelf unit U10 into the coating unit U1 and the heat treatment unit U2 within the processing floor 11. Further, the control device 100 controls the coating unit U1 and the heat treatment unit U2 to form the bottom film on the surface of the wafer W. Thereafter, the control device 100 controls the transfer device A3 to return the wafer W having the bottom film formed thereon back into the shelf unit U10, and then, controls the elevating device A7 to place this wafer W in the cell for the processing floor 12.

Subsequently, the control device 100 controls the transfer device A3 to transfer the wafer W in the shelf unit U10 into the coating unit U1 and the heat treatment unit U2 within the processing floor 12. Further, the controller 100 controls the coating unit U1 and the heat treatment unit U2 to form the resist film on the bottom film of the wafer W. Thereafter, the control device 100 controls the transfer device A3 to return the wafer W back into the shelf unit U10, and controls the elevation device A7 to place this wafer W in the cell for the processing floor 13.

Afterwards, the control device 100 controls the transfer device A3 to transfer the wafer W of the shelf unit U10 to the respective units within the processing floor 13, and controls the coating unit U1 and the heat treatment unit U2 to form the top film on the resist film of the wafer W. Then, the control device 100 controls the transfer device A3 to transfer the wafer W to the shelf unit U11.

Thereafter, the control device 100 controls the delivery device A8 to deliver the wafer W of the shelf unit U11 to the exposure apparatus 3. Then, the control device 100 controls the delivery device A8 to receive from the exposure apparatus 3 the wafer W, on which the exposure processing has been performed, and place the received wafer W in the cell within the shelf unit U11 for the processing floor 14.

Thereafter, the control device 100 controls the transfer device A3 to transfer the wafer W of the shelf unit U11 into the respective units within the processing floor 14, and controls the coating unit U1 and the heat treatment unit U2 to perform the developing processing on the resist film of the wafer W. Then, the control device 100 controls the transfer device A3 to return the wafer W to the shelf unit U10, and controls the elevating device A7 and the delivery device A1 to return this wafer W back into the carrier C. Then, the coating and developing processing is ended.

Further, the specific configuration of the substrate processing apparatus is not limited to the above-descried example configuration of the coting and developing apparatus 2. The substrate processing apparatus is not particularly limited as long as it is equipped with the processing module such as the coating unit U1 configured to perform the processing on the wafer W; the transfer device configured to transfer the wafer W to the processing module; and the control device 100 configured to control the processing module and the transfer device.

Now, a specific example of the internal configuration of the processing floor 11 will be described. FIG. 3 is a plan view schematically illustrating the internal configuration of the processing floor 11. Within the processing floor 11, the plurality of (here, five) coating units U1 and the plurality of (here, five) heat treatment units U2 are arranged along the Y-axis direction. Within the processing floor 11, the transfer device A3 is disposed between the plurality of coating units U1 and the plurality of heat treatment units U2. A transfer chamber TR is provided between an area where the coating units U1 are disposed and an area where the heat treatment units U2 are disposed. The transfer chamber TR is located outside the coating unit U1 and the heat treatment unit U2. The transfer device A3 is disposed within the transfer chamber TR.

The shelf unit U10 and the shelf unit U11 are arranged at opposite sides with the transfer chamber TR therebetween in the Y-axis direction. That is, the shelf unit U10 and the shelf unit U11 are arranged with the coating units U1 and the heat treatment units U2 therebetween in the Y-axis direction. Hereinafter, a side where the shelf unit U10 is provided will be referred to as "negative Y-axis direction," and a side where the shelf unit U11 is provided will be referred to as "positive Y-axis direction." Further, a side where the coating unit U1 is provided will be referred to as "negative X-axis direction," and a side where the heat treatment unit U2 is provided will be referred to as "positive X-axis direction." To indicate a preset coating unit U1 (heat treatment unit U2) among the plurality coating units U1 (the plurality of heat treatment units U2), the coating unit U1 (heat treatment unit U2) may be specified by using an order counted from the negative Y-axis direction.

[Transfer Device]

Figure 4:
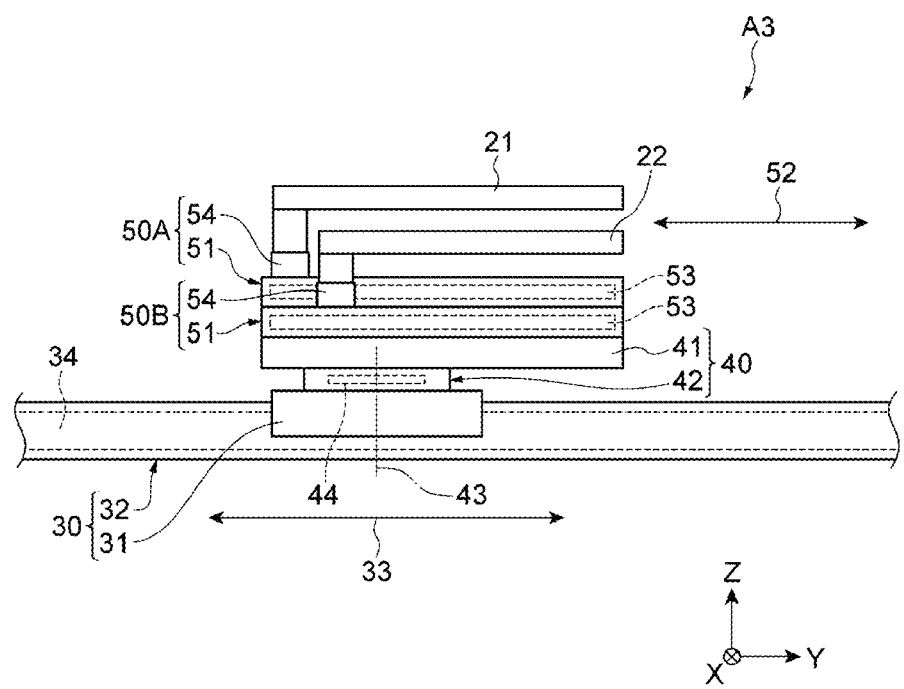
FIG. 4 is a schematic diagram illustrating an example configuration within a transfer device.

Now, a configuration of the transfer device A3 will be elaborated. As depicted in FIG. 4, the transfer device A3 includes an arm 21, an arm 22, a moving device 30 for movement (first moving device), a moving device 40 for rotation (third moving device), a moving device 50A for access (second moving device), and a moving device 50B for access (second moving device).

Each of the arms 21 and 22 is configured to support the wafer W as a transfer target. The arm 21 is located above the arm 22. Since the transfer device A3 is equipped with the two arms 21 and 22, the transfer device A3 is capable of holding two sheets of wafers W.

The moving device 30 for movement is configured to move the arms 21 and 22 along a first line 33. In the present exemplary embodiment, the first line 33 accords to the Y-axis direction in the transfer chamber TR at the outside of the coating unit U1 and the heat treatment unit U2. As the first line 33 accords to the Y-axis direction, a direction in which the moving device 30 for movement moves the arms 21 and 22 corresponds to a direction in which the coating units U1 are arranged or a direction in which the heat treatment units U2 are arranged. The moving device 30 for movement is equipped with a moving stage 31 and a linear actuator 32. The moving stage 31 may be, by way of example, a plate-shaped base, and is configured to support the arms 21 and 22.

The linear actuator 32 is configured to move the moving stage 31 along the first line 33. By way of example, the actuator 32 has a power source configured to generate a rotational torque and a timing belt 34 wound around a pair of pulleys. For example, the rotational torque generated by the power source is converted into a translating force along the first line 33 by the timing belt 34, and then, delivered to the moving stage 31. As a result, the moving stage 31 can be moved along the first line 33.

The moving devices 50A and 50B for access are provided on the moving stage 31 and moved along with the moving stage 31. The moving device 50A for access is configured to move the arm 21 along a second line 52 (access/retreat the arm 21 to/from a target unit). The moving device 50B for access is configured to move the arm 22 along the second line 52 (access/retreat the arm 22 to/from the target unit). Each of the moving devices 50A and 50B for access has a linear actuator 51 and an elevating actuator 54.

For example, the linear actuator 51 has a power source configured to generate a rotational torque and a timing belt 53 wound around a pair of pulleys. For example, the rotational torque generated by the power source is converted into a translating force along the second line 52 by the timing belt 53, and then, delivered to the arms 21 and 22. As a result, the arms 21 and 22 can be moved along the second line 52. The linear actuator 51 reciprocates the arms 21 and 22 from a stand-by position to an advanced position. The stand-by position is a position within an area above the moving stage 31, and the advanced position is a position outside the area above the moving stage 31. The elevating actuator 54 are configured to, for example, support the arms 21 and 22 and move the arms 21 and 22 up and down. For example, the elevating actuator 54 moves the arms 21 and 22 up and down for the transfer of the wafer W.

The moving device 40 for rotation is provided between the moving device 30 for movement and the moving devices 50A and 50B for access, and configured to be moved along with the moving stage 31. The moving device 40 for rotation is configured to rotate the moving devices 50A and 50B for access around a vertical axis 43. Accordingly, an angle of the second line 52 with respect to the first line 33 (hereinafter, simply referred to as "angle of the second line 52") is changed. That is, the moving device 40 for rotation changes a moving direction (heading direction) of the arms 21 and 22. That is, the moving device 40 for rotation changes an access/retreat direction of the arms 21 and 22.

The angle of the second line 52 is changed within a range from, e.g., 0° to ±180° by the moving device 40 for rotation. In the following description, if a direction in which the arms 21 and 22 head toward the advanced position from the stand-by position coincides with the positive Y-axis direction, the angle of the second line 52 is defined as 0°. If the direction in which the arms 21 and 22 head toward the advanced position from the stand-by position coincides with the negative Y-axis direction, the angle of the second line 52 is defined as 180° (−180°). If the direction in which the arms 21 and 22 head toward the advanced position from the stand-by position coincides with the positive X-axis direction, the angle of the second line 52 is defined as 90°. If the direction in which the arms 21 and 22 head toward the advanced position from the stand-by position coincides with the negative X-axis direction, the angle of the second line 52 is defined as −90°. FIG. 4 illustrates a configuration of the transfer device A3 when the angle of the second line 52 is 0°.

The moving device 40 for rotation is equipped with a rotary stage 41 and a rotational actuator 42. The rotational actuator 42 is configured to rotate the rotary stage 41 around the axis 43. For example, the rotational actuator 42 includes a power source configured to generate a rotational torque and a timing belt 44 wound around a pair of pulleys. By way of example, the rotational torque generated by the power source is delivered to the rotary stage 41 via the timing belt 44, thus allowing the rotary stage 41 to be rotated around the axis 43. The rotary stage 41 is, for example, a plate-shaped base. The rotary stage 41 holds the moving devices 50A and 50B for access and the arms 21 and 22. That is, along with the rotation of the rotary stage 41, the moving devices 50A and 50B for access and the arms 21 and 22 are also rotated around the axis 43. Since the moving device 40 for rotation is held by the moving stage 31, the moving device 40 for rotation, the moving devices 50A and 50B for access and the arms 21 and 22 are moved along the first line 33 as the moving stage 31 is moved.

Figure 5:
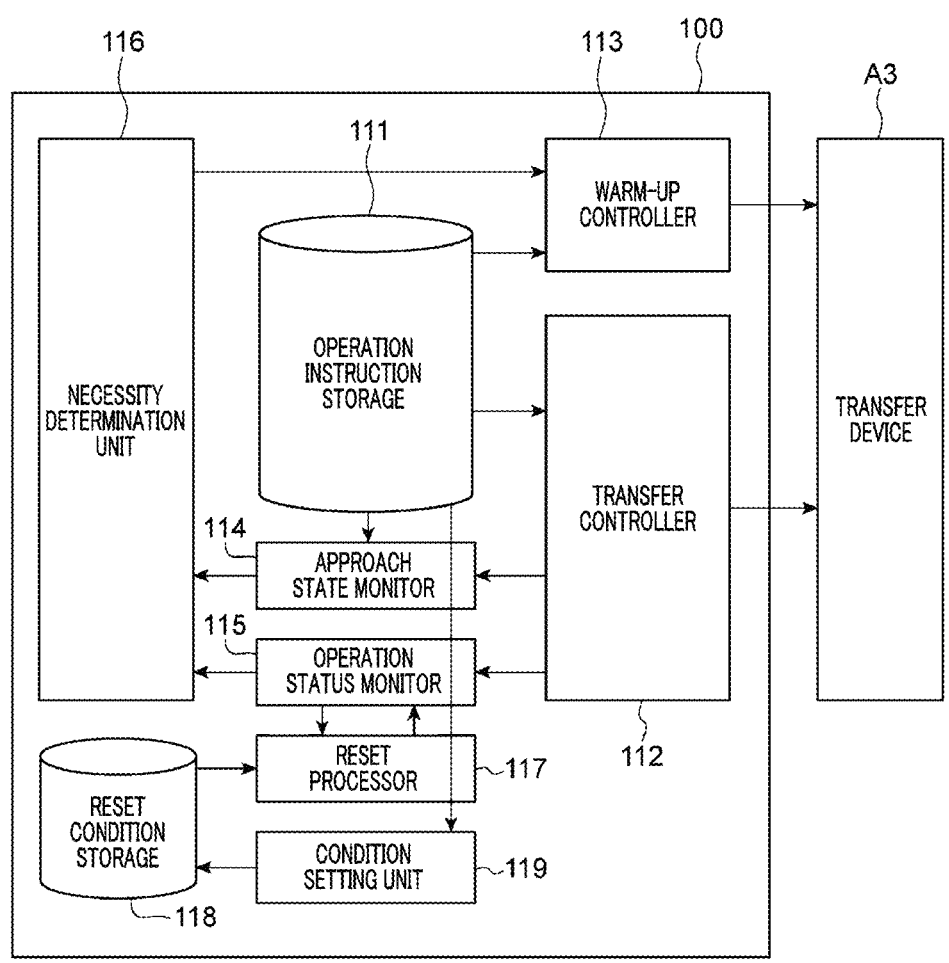
FIG. 5 is a block diagram illustrating an example functional configuration of a control device.

The transfer device A3 having the above-described configuration is controlled by the control device 100. The control device 100 is configured to control the transfer device A3 to perform a normal transfer of transferring the wafer W and a high-accuracy transfer of transferring the wafer W with higher positioning accuracy as compared to the normal transfer. The control device 100 is also configured to control the transfer device A3 to perform a warm-up operation different from the normal transfer and the high-accuracy transfer, when necessary. The control device 100 is configured to make a determination that the warm-up operation is required as the beginning of the high-accuracy transfer is approaching when a duration of a stop state of the transfer device A3 exceeds a preset reference time. By way of example, the control device 100 is equipped with, as functional components (hereinafter, referred to as "functional modules"), an operation instruction storage 111, a transfer controller 112, a warm-up controller 113, an approach state monitor 114, an operation status monitor 115, a necessity determination unit 116, a reset processor 117, a reset condition storage 118 and a condition setting unit 119, as illustrated in FIG. 5.

The operation instruction storage 111 is configured to store therein a warm-up operation instruction and a transfer operation instruction with respect to the transfer device A3. For example, the transfer operation instruction includes information upon a sequence in which the transfer is performed, information upon the wafer W as the transfer target, information upon a unit as a departure point (hereinafter, referred to as "departure unit") and a unit as a destination point (hereinafter, referred to as "destination unit") in each transfer, and so forth. Here, the departure unit is a unit from which the transfer device A3 takes the wafer W as the transfer target, and the destination unit is a unit to which the transfer device A3 delivers the wafer W as the transfer target. That is, the transfer device A3 transfers the wafer W as the transfer target from the departure unit to the destination unit. In the present exemplary embodiment, the departure unit and the destination unit are one of the coating unit U1, the heat treatment unit U2 and the shelf units U10 and U11.

The transfer controller 112 controls the transfer device A3 to perform the normal transfer of transferring the wafer W and the high-accuracy transfer of transferring the wafer W with higher positioning accuracy as compared to the normal transfer. The transfer controller 112 controls the transfer device A3 to perform a transfer operation based on the transfer operation instruction acquired from the operation instruction storage 111. The transfer operation includes a normal transfer operation for performing the normal transfer and a high-accuracy operation for performing the high-accuracy transfer. Any of these two transfer operations may include a take-over operation performed by the transfer device A3 which does not hold the wafer W. Here, the term "transfer" means all operations ranging from an operation of taking one wafer (as the transfer target) from the departure unit to an operation of placing this wafer W at a preset position (for example, a processing position) within the destination unit.

Figure 6A:
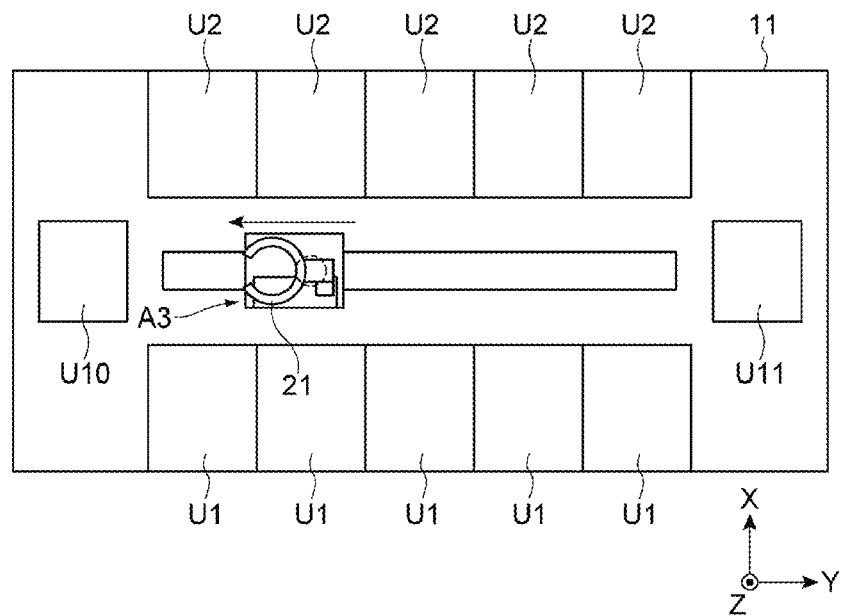
FIG. 6A and FIG. 6B are diagrams for describing an example of a normal transfer.
Figure 6B:
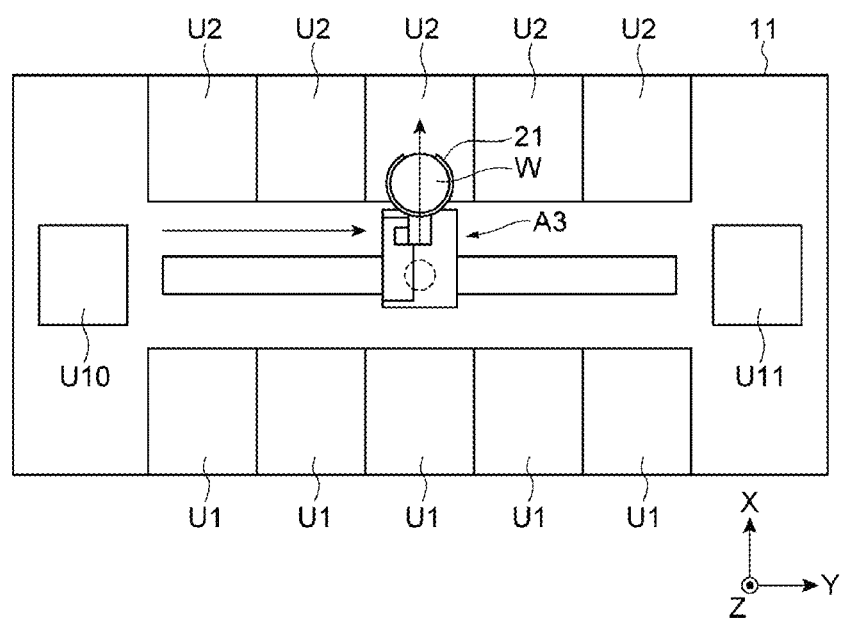

FIG. 6A and FIG. 6B illustrate an example of the normal transfer operation by the transfer device A3. This normal transfer operation includes the take-over operation. As depicted in FIG. 6A, the transfer controller 112 first operates the moving device 30 for movement, thus allowing the arms 21 and 22 to be moved in the negative Y-axis direction. To elaborate, by operating the linear actuator 32, the transfer controller 112 moves the moving stage 31 up to a position where the arm 21 can access the shelf unit U10 and receive the wafer W within the shelf unit U10. Then, the transfer controller 112 controls the arm 21 to enter the shelf unit U10 and receive the wafer W placed in the shelf unit U10. By way of example, the transfer controller 112 allows the arm 21 to enter the shelf unit U10 by operating the linear actuator 51 of the moving device 50A for access, and allows the wafer W to be held on the arm 21 by moving the arm 21 upwards with the elevating actuator 54. Then, the transfer controller 112 retreats the arm 21 from the shelf unit U10 by operating the linear actuator 51 and then lowers the arm 21 by the elevating actuator 54. The above-described operation corresponds to the take-over operation.

FIG. 6B illustrates an operation of transferring the wafer W from the shelf unit U10 to a third heat treatment unit U2. Upon the completion of the above-stated take-over operation, the transfer controller 112 moves the arms 21 and 22 to a position of the third heat treatment unit U2 in the Y-axis direction by operating the moving device 30 for movement. Then, by operating the moving device 40 for rotation, the transfer controller 112 rotates the moving devices 50A and 50B for access until the angle of the second line 52 reaches 90°. Thereafter, the transfer controller 112 allows the arm 21 to enter the third heat treatment unit U2 and place the wafer W at the processing position within the third heat treatment unit U2. By way of example, the transfer controller 112 allows the arm 21 to enter the third heat treatment unit U2 by operating the linear actuator 51 after raising the arm 21 by the elevating actuator 54 of the moving device 50A for access. Then, the transfer controller 112 allows the wafer W to be placed at the processing position within the third heat treatment unit U2 by lowering the arm 21 with the elevating actuator 54. Afterwards, the transfer controller 112 retreats the arm 21 from the third heat treatment unit U2 by operating the linear actuator 51.

Figure 7A:
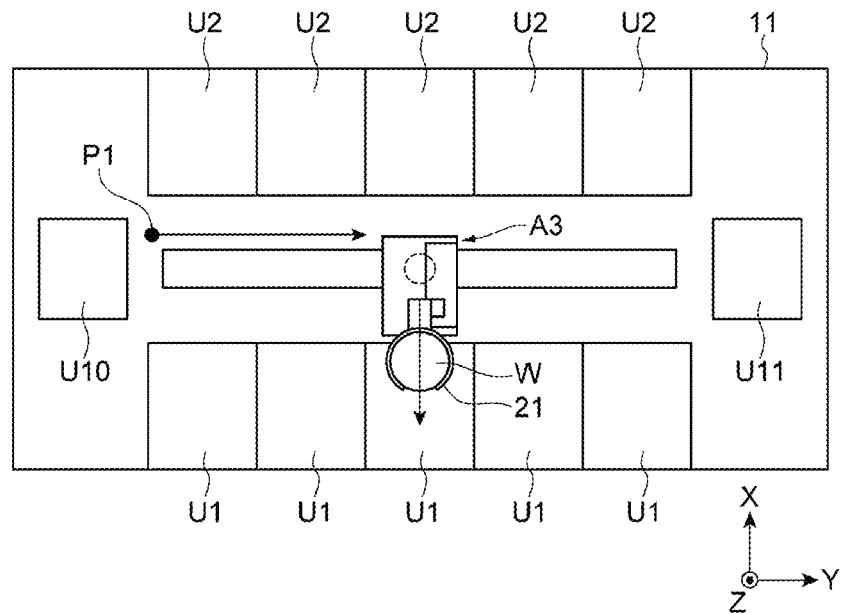
FIG. 7A and FIG. 7B are diagrams for describing an example of a high-accuracy transfer.
Figure 7B:
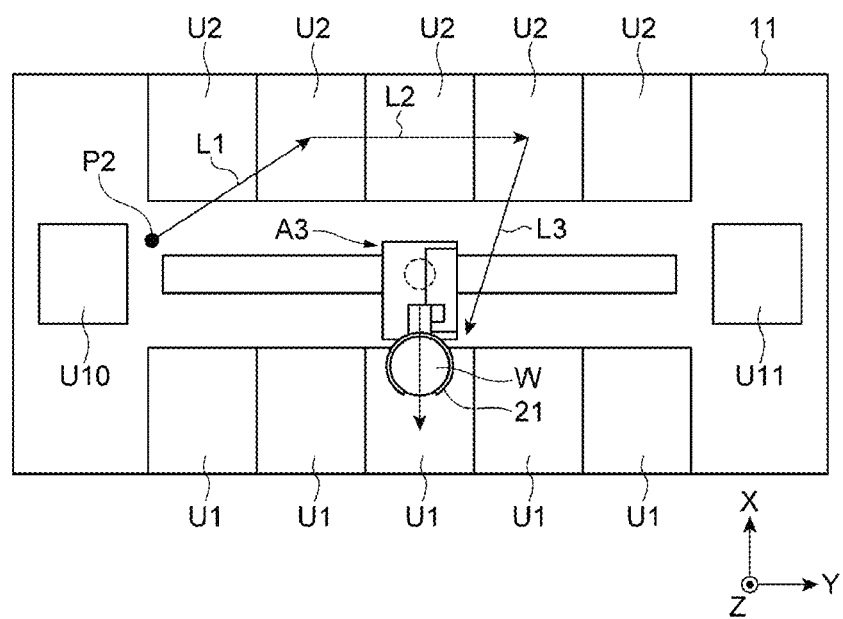

FIG. 7A and FIG. 7B illustrates an example of the high-accuracy transfer operation by the transfer device A3. The high-accuracy transfer is performed when transferring the wafer into the destination unit where the wafer W is required to be transferred with high positioning accuracy, as compared to the destination unit of the normal transfer. For example, in the high-accuracy transfer, the wafer W is transferred such that a difference between the processing position within the destination unit and a position (placing position) where the wafer W is actually placed is merely about several tens of micrometers (μm). In the present exemplary embodiment, the high-accuracy transfer is performed when transferring the wafer W into the coating unit U1. For instance, if an edge portion (peripheral portion) of the transferred wafer W is cut in a preset width within the coating unit U1, the positioning accuracy in the placing position needs to be high such that the cut width is substantially uniform along the entire circumference of the wafer W.

FIG. 7A illustrates the high-accuracy operation of transferring the wafer W from the shelf unit U10 to the third coating unit U1. As depicted in FIG. 7A, the transfer controller 112 operates the moving device 30 for movement, thus allowing the arms 21 and 22 to be moved up to the position of the third coating unit U1 in the Y-axis direction. Then, by operating the moving device 40 for rotation, the transfer controller 112 rotates the moving devices 50A and 50B for access until the angle of the second line 52 reaches −90°. Thereafter, the transfer controller 112 allows the arm 21 to enter the third coating unit U1 and place the wafer W at the processing position within the third coating unit U1.

FIG. 7B illustrates a series of operations including the high-accuracy transfer operation of transferring the wafer W to the third coating unit U1 from a fourth heat treatment unit U2 and operations performed before the high-accuracy operation. These series of operations are operations performed in the state that the transfer device A3 holds at least one wafer W among the plurality of wafers W. These series of operations may include operations before and after a swapping operation of swapping two different wafers W and an operation (take-over operation) in which the transfer device A3 which does not hold the wafer W first receives the wafer W.

As shown in FIG. 7B, the transfer controller 112 operates the transfer device A3 along operation lines L1, L2 and L3. The operation line L1 schematically illustrates a transfer of the wafer W from the shelf unit U10 to a second heat treatment unit U2. The transfer controller 112 controls the transfer device A3 to transfer the wafer W from the shelf unit U10 to the second heat treatment unit U2. To elaborate, the transfer controller 112 moves the arms 21 and 22 to the position of the second heat treatment unit U2 by the moving device 30 for movement. Then, the transfer controller 112 rotates the moving devices 50A and 50B for access by the moving device 40 for rotation such that the angle of the second line 52 becomes 90°. Thereafter, the transfer controller 112 controls the transfer device A3 to perform the swapping operation of swapping two different wafers W in the second heat-treatment unit U2. To elaborate, the transfer controller 112 allows the arm 22 to enter the second heat treatment unit U2 and receive the wafer W placed in the second heat treatment unit U2. After the arm 22 receives the wafer W, the transfer controller 112 allows the arm 21 to enter the second heat treatment unit U2 and place the wafer W held on the arm 21 at the processing position in the second heat treatment unit U2.

The operation line L2 schematically illustrates a transfer of the wafer W from the second heat treatment unit U2 to the fourth heat treatment unit U2. The transfer controller 112 controls the transfer device A3 to move the wafer W received from the second heat treatment unit U2 to the fourth heat treatment unit U2. To elaborate, the transfer controller 112 moves the arms 21 and 22 to the position of the fourth heat treatment unit U2 by the moving device 30 for movement. Then, the transfer controller 112 controls the transfer device A3 to perform the swapping operation of swapping the wafer W held by the arm 22 and the wafer W placed in the fourth heat treatment unit U2. The third operation line L3 schematically illustrates a transfer of the wafer W from the fourth heat treatment unit U2 to the third coating unit U1. The transfer of the wafer W indicated by the operation line L3 is the high-accuracy transfer. The transfer controller 112 allows the wafer W received from the fourth heat treatment unit U2 to be delivered to the third coating unit U1 by the transfer device A3. To elaborate, the transfer controller 112 moves the arm 21 and 22 to the third coating unit U1 by the moving device 30 for movement, and rotates the moving devices 50A and 50B for access by the moving device 40 for rotation such that the angle of the second line 52 becomes 90°. Thereafter, the transfer controller 112 allows the arm 21 to enter the third coating unit U1 and place the wafer W, which is held by the arm 21, at the processing position of the third coating unit U1.

The warm-up controller 113 controls the transfer device A3 to perform a warm-up operation (warming-up operation), which is different from the normal transfer and the high-accuracy transfer, when necessary. In response to a signal indicating necessity of the warm-up operation, which is received from the necessity determination unit 116, the warm-up controller 113 controls the transfer device A3 to perform the warm-up operation. That is, the warm-up controller 113 does not allow (prohibits) the transfer device A3 to perform the warm-up operation when the signal indicating the necessity of the warm-up operation is not received from the necessity determination unit 116.

The warm-up controller 113 controls the transfer device A3 which does not hold the wafer W to perform the warm-up operation based on an instruction regarding the warm-up operation which is stored in the operation instruction storage 111. The warm-up operation includes an operation of moving the transfer device A3 away from the wafer W as the take-over target in the take-over operation. The warm-up operation is, for example, an operation which allows the timing belt included in the transfer device A3 to be settled. By way of example, an extension characteristic of the timing belt is changed to be converged on a preset condition as the operation of the transfer device A3 is repeated. This converged extension characteristic of the timing belt is referred to as "convergence characteristic" herein. By way of example, the warm-up operation is an operation for allowing the extension characteristic of the timing belt to become close to the convergence characteristic.

The warm-up controller 113 operates (drives) the moving device 30 for movement, the moving device 40 for rotation and the moving devices 50A and 50B for access individually, thus allowing the transfer device A3 to perform the warm-up operation. For example, the warm-up controller 113 operates the moving device 30 for movement, the moving device 40 for rotation and the moving devices 50A and 50B for access individually not to allow the arms 21 and 22 to enter the coating unit U1 and the heat treatment unit U2. For instance, a state where the arms 21 and 22 do not enter the coating unit U1 is a state where, when viewed from the top, the arms 21 and 22 and the coating unit U1 are not overlapped. That is, the warm-up controller 113 operates these moving devices within the transfer chamber TR. For example, the warm-up controller 113 operates at least a part of these moving devices to be reciprocated with a full stroke more than one time. The warm-up controller 113 may operate the moving device 30 for movement, the moving device 40 for rotation and the moving devices 50A and 50B for access in sequence, or may operate these moving devices such that operating times of at least any two of these moving devices are at least partially overlapped. It is determined based on, for example, a length of the timing belt included in each moving device which one of the moving devices the warm-up operation will be performed for. When carrying out the warm-up operation, the warm-up controller 113 operates the moving device 30 for movement and the moving devices 50A and 50B for access at least. When carrying out the warm-up operation, the warm-up controller 113 may further operate the moving device 40 for rotation as well as the moving device 30 for movement and the moving devices 50A and 50B for access.

Figure 8A:
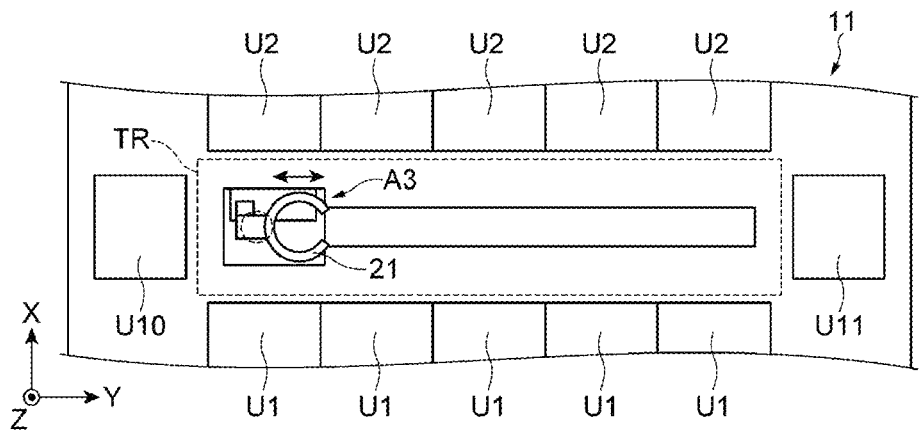
FIG. 8A to FIG. 8C are diagrams for describing an example of a warm-up operation.
Figure 8B:
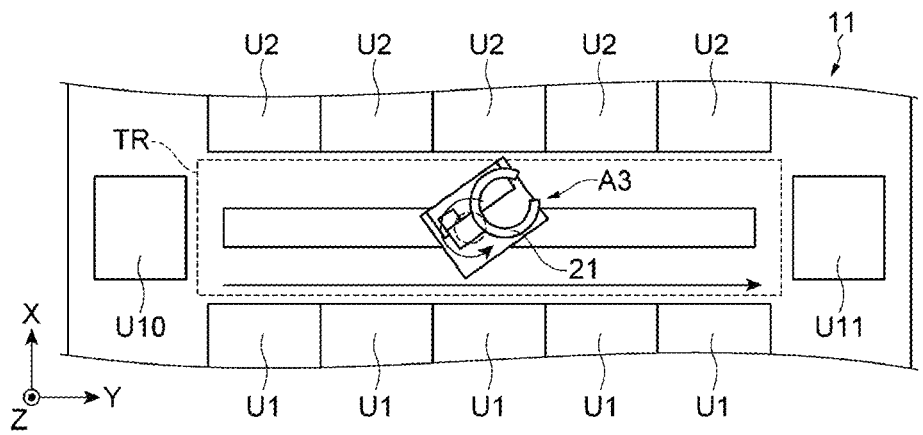
Figure 8C:
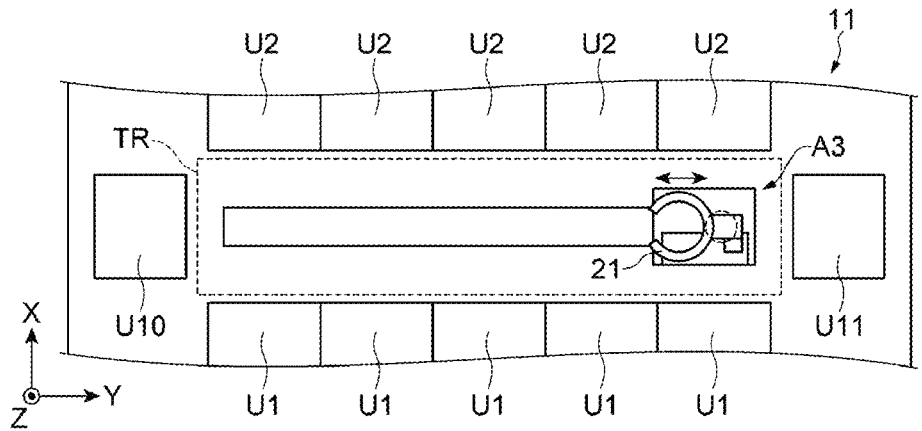

Referring to FIG. 8A to FIG. 8C, a specific example of the warm-up operation will be explained. First, the warm-up controller 113 moves the arms 21 and 22 to near the shelf unit U10 by the moving device 30 for movement, as illustrated in FIG. 8A. Then, the warm-up controller 113 rotates the moving devices 50A and 50B for access by the moving device 40 for rotation such that the angle of the second line 52 becomes 0°. While setting the second line 52 to follow the first line 33 by driving the linear actuator 51 of each of the moving devices 50A and 50B for access, the arms 21 and 22 are reciprocated with a full stroke. For example, in the state that the second line 52 follows the first line 33, the second line 52 needs to be as close to the first line 33 as a preset degree of closeness. For example, the preset degree of closeness may be closeness which enables the linear actuator 51 to be operated with the full stroke in the state that the arms 21 and 22 are not advanced into the coating unit U1 or the heat treatment unit U2 at least.

Now, as shown in FIG. 8B, the warm-up controller 113 moves the moving stage 31 along the first line 33 (Y-axis direction) with a full stroke by operating the liner actuator 32 of the moving device 30 for movement. Further, the warm-up controller 13 rotates the moving devices 50A and 50B for access by operating the moving device 40 for rotation. The operation of the moving device 30 for movement and the operation of the moving device 40 for rotation may be performed in any sequence. For example, the warm-up controller 13 may rotate the moving devices 50A and 50B for access by 180° (half-turn) by the moving device 40 for rotation after moving the arms 21 and 22 to near the shelf unit U11 by the moving device 30 for movement. Then, as illustrated in FIG. 8C, the warm-up controller 113 moves the arms 21 and 22 back and forth with a full stroke in the state that the second line 52 follows the first line 33. Thereafter, the warm-up controller 113 may move the moving stage 31 with the full stroke toward the negative Y-axis direction by operating the linear actuator 32 of the moving device 30 for movement.

The approach state monitor 114 is configured to monitor an approach state (approach level) of a beginning of the high-accuracy transfer. To elaborate, the approach state monitor 114 monitors the approach state of the beginning of the high-accuracy transfer at a current time point, based on a current operation status of the transfer device A3 obtained from the transfer controller 112 and the transfer operation instruction obtained from the operation instruction storage 111.

The operation status monitor 115 is configured to monitor the operation status of the transfer device A3. To elaborate, the operation status monitor 115 monitors an operation direction and an operation amount of each moving device and counts the duration of the stop state of the transfer device A3. Here, the "stop state of the transfer device A3" refers to a state in which at least one of the moving device 30 for movement, the moving device 40 for rotation and the moving devices 50A and 50B for access is stopped continuously or intermittently for a preset time. In the present exemplary embodiment, it is considered that the stop state of the transfer device A3 is continued until the count of the duration is reset by the reset processor 117.

If the duration of the stop state of the transfer device A3 exceeds the preset reference time, the necessity determination unit 116 makes a determination that the warm-up operation is necessary as the beginning of the high-accuracy transfer is approaching. Based on the information upon the approach state from the approach state monitor 114 and the count of the duration from the operation status monitor 115, the necessity determination unit 116 determines whether the duration exceeds the reference time and whether the beginning of the high-accuracy transfer is approaching. For example, when the duration of the stop state of the transfer device A3 exceeds the preset reference time, the necessity determination unit 116 makes a determination that the warm-up operation is required if the approach level of the beginning of the high-accuracy transfer satisfies a preset approach condition.

As an example of the approach condition, the approach level (current time) may reach a time within a predetermined time until the beginning of the high-accuracy transfer (for example, a time when the transfer device A3 reaches a point P1 in FIG. 7A). As another example of the approach condition, the approach level may reach a beginning of the above-described series of operations including the high-accuracy transfer (for example, a time when the transfer device A3 reaches a point P2 in FIG. 7B).

If the duration of the stop state of the transfer device A3 does not reach the reference time, the necessity determination unit 116 makes a determination that the warm-up operation is not needed. In this case, the warm-up controller 113 does not allow the transfer device A3 to perform the warm-up operation. Further, if the approach level of the beginning of the high-accuracy transfer does not satisfy the approach condition even if the duration of the stop state of the transfer device A3 meets the reference time, the necessity determination unit 116 still makes a determination that the warm-up operation is not needed. In this case as well, the warm-up controller 113 does not allow the transfer device A3 to perform the warm-up operation. By way of example, when only the normal transfer is performed as the duration satisfies the reference time, the warm-up operation is not performed even if the beginning of the normal transfer is approaching.

The reset processor 117 resets the duration of the stop state of the transfer device A3 as the operation of the transfer device A3 satisfies a reset condition. That is, if the operation of the transfer device 117 satisfies the reset condition, the reset processor 117 returns the count of the duration by the operation status monitor 115 to zero. The reset processor 117 obtains the reset condition from the reset condition storage 118. For example, if an operating distance of any one moving device exceeds a reset distance set in the reset condition storage 118, the reset processor 117 makes a determination that the operation of the moving device satisfies the reset condition. Alternatively, if an operation duration of any one moving device exceeds a reset time set in the reset condition storage 118, the reset processor 117 makes the determination that the operation of the moving device satisfies the reset condition. Further, the reset condition may be set to be of different values for the operations of the moving device 30 for movement, the moving device 40 for rotation and the moving devices 50A and 50B for access.

Figure 9A:
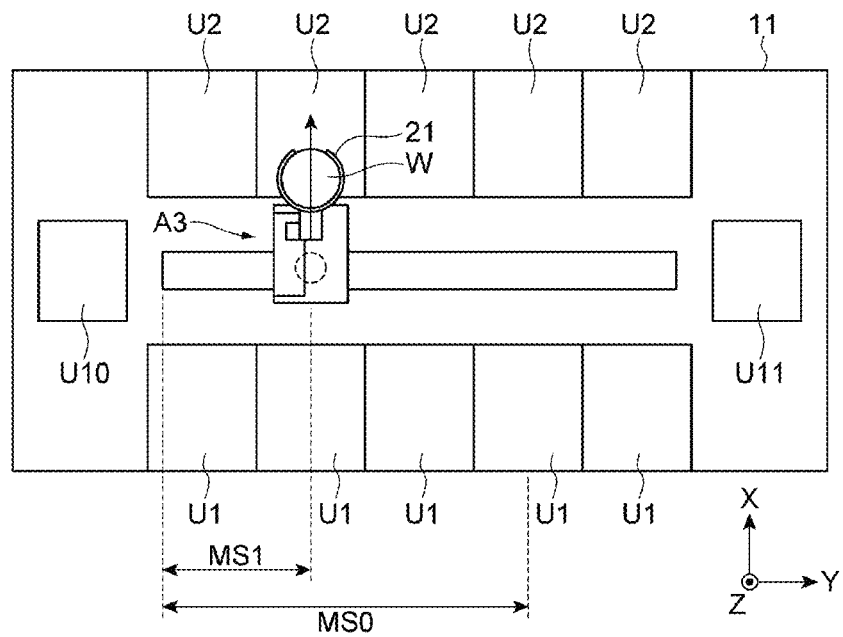
FIG. 9A and FIG. 9B are diagrams for describing an example regarding whether or not a reset condition is satisfied.
Figure 9B:
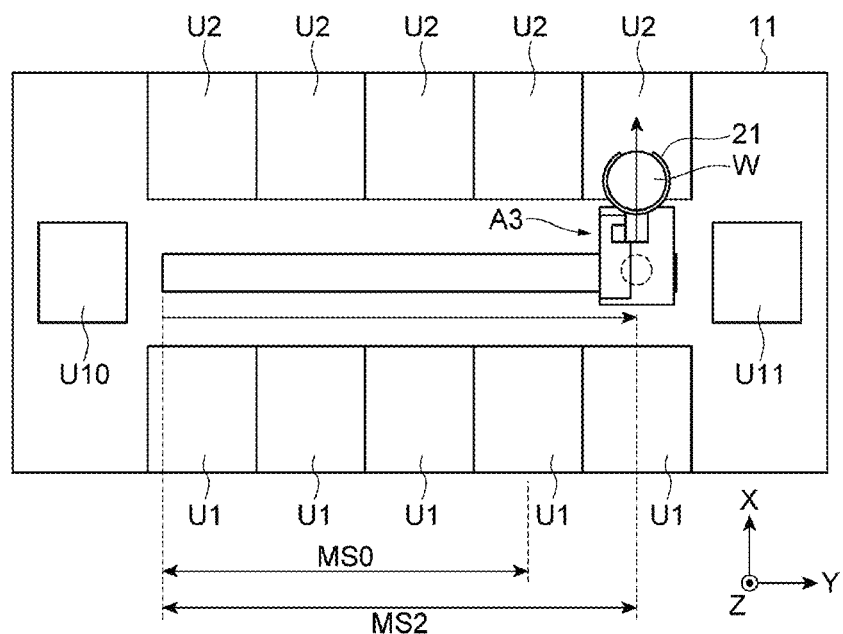

Referring to FIG. 9A and FIG. 9B, an example of an operation which satisfies the reset condition for the moving device 30 for movement and an example of an operation which does not satisfy the reset condition for the moving device 30 for movement will be explained. In the examples shown in FIG. 9A and FIG. 9B, the reset distance for the moving device 30 for movement is set as a reference stroke MS0. The reference stoke MS0 corresponds to a moving amount of the moving stage 31 (arms 21 and 22) from a position closest to the shelf unit U10 to a position of the fourth heat treatment unit U2 in the Y-axis direction. In the example shown in FIG. 9A, the arms 21 and 22 are moved along the Y-axis direction from the position where the arms 21 and 22 get closest to the shelf unit U10 to a position of the second heat treatment unit U2 by the moving device 30 for movement, and the arm 21 is moved along the X-axis direction by the moving device 50A for access. The moving stage 31 (arms 21 and 22) is moved by a moving stroke MS1. Since the moving stroke MS1 is smaller than the reference stroke MS0, the reset processor 117 makes a determination that the operation of the moving device 30 for movement does not meet the reset distance. That is, the duration of the stop state of the transfer device A3 is not reset, and a determination that the stop state of the transfer device A3 continues is made.

In the example shown in FIG. 9B, the arms 21 and 22 are moved along the Y-axis direction from the position where the arms 21 and 22 get closest to the shelf unit U10 to a position of the fifth heat treatment unit U2 by the moving device 30 for movement, and the arm 21 is moved along the X-axis direction by the moving device 50A for access. The moving stage 31 (arms 21 and 22) is moved by a moving stroke MS2. Since the moving stroke MS2 is larger than the reference stroke MS0, the reset processor 117 makes a determination that the operation of the moving device 30 for movement satisfies the reset distance. In this case, the reset processor 117 may reset the duration of the stop state of the transfer device A3.

The reset processor 117 may check whether the operation of each moving device satisfies the reset condition and whether the transfer operation (normal transfer operation) of the transfer device A3 satisfies the reset condition based on a time difference between times when the operations of the moving devices satisfy the reset condition. The reset processor 117 may reset the duration of the stop state of the transfer device A3 when the operations of at least two of the moving device 30 for movement, the moving device 40 for rotation and the moving devices 50A and 50B for access satisfy the reset condition with a time difference within a preset time. By way of example, the reset processor 117 may make the determination that the reset condition is satisfied when the time difference between the time when the operation of the moving device 30 for movement exceeds the reset distance and the time when the operation of the moving devices 50A and 50B for access exceeds the reset distance is smaller than the preset time.

The condition setting unit 119 sets the reset condition based on an operation stroke of the transfer device A3 in the high-accuracy transfer at least. Here, the operation stroke may be an average of the operation strokes of the moving devices or a maximum of the operation strokes of the moving devices. By way of example, the condition setting unit 119 may set, as the reset condition (for example, the reset distance), a value obtained by subtracting or adding a preset value from/to the average or the maximum of the operation strokes of the moving devices. The reset condition set by the condition setting unit 119 is stored in the reset condition storage 118.

Figure 10:
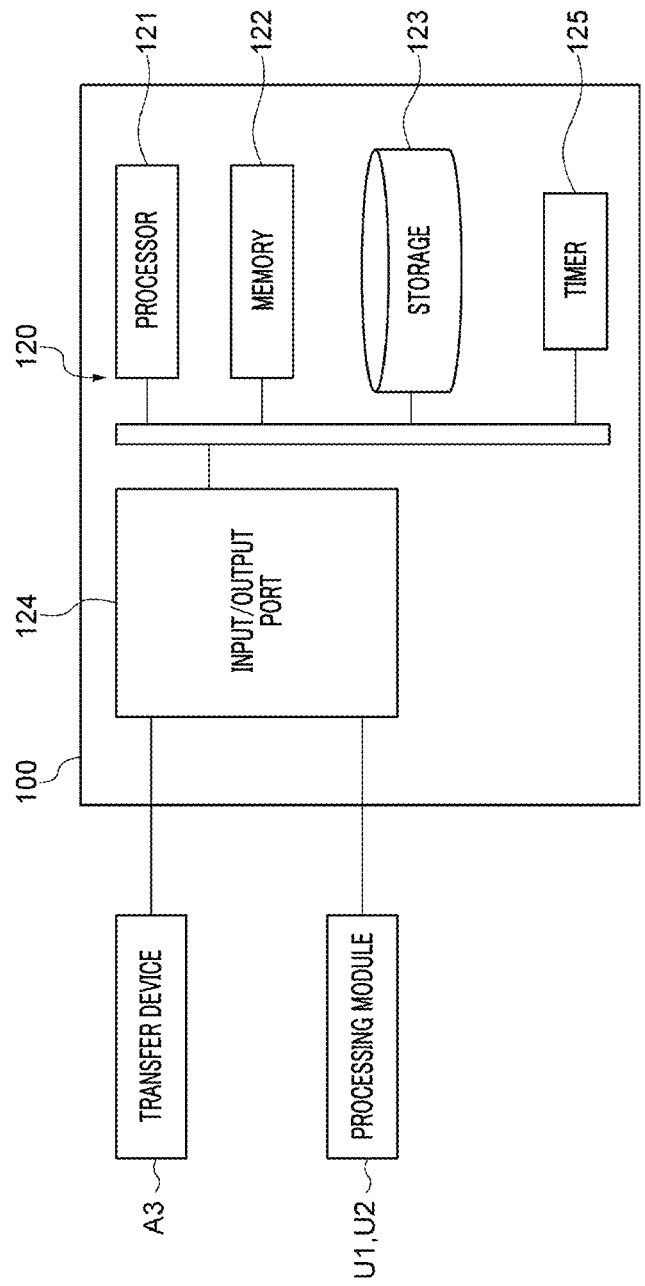
FIG. 10 is a block diagram illustrating an example of a hardware configuration of the control device.

The control device 100 is composed of one or more control computers. By way of example, the control device 100 has a circuit 120 shown in FIG. 10. The circuit 120 is equipped with one or more processors 121, a memory 122, a storage 123, an input/output port 124 and a timer 125. The storage 123 has a computer-readable recording medium such as, but not limited, a hard disk. The recording medium stores therein programs that cause the transfer device A3 to carry out a transfer processing sequence to be described later. The recording medium may be a portable medium such as, but not limited to, a non-volatile semiconductor memory, a magnetic disk or an optical disk. The memory 122 temporarily stores thereon the programs loaded form the recording medium of the storage 123 and operation results by the processor 121. The processor 121 executes the programs in cooperation with the memory 122, thus constituting the above-described individual functional modules. The input/output port 124 is configured to perform an input/output of an electric signal between the transfer device A3, the coating unit U1 and the heat treatment unit U2 in response to an instruction from the processor 121. The timer 125 is configured to measure an elapsed time (for example, the duration of the stop state) by counting a reference pulse of a preset cycle, for example.

Further, the hardware configuration of the control device 100 is not limited to constituting the individual functional modules by the programs. By way of example, each functional module of the control device 100 may be implemented by a dedicated logical circuit or an ASIC (Application Specific Integrated Circuit) which is an integration of the logical circuits.

[Substrate Processing Method]

Now, the transfer processing sequence performed by the transfer device A3 will be descried as an example of a substrate processing method. This transfer processing sequence includes causing the transfer device A3 to perform the normal transfer of transferring at least one wafer W as the processing target and the high-accuracy transfer of transferring the wafer W with higher positioning accuracy as compared to the normal transfer. This transfer processing sequence further includes causing the transfer device A3 to perform the warm-up operation, which is different from the normal transfer and the high-accuracy transfer, when necessary. This transfer processing sequence further includes making a determination that the warm-up operation is required as the beginning of the high-accuracy transfer is approaching when the duration of the stop state of the transfer device A3 exceeds the preset reference time.

Figure 11:
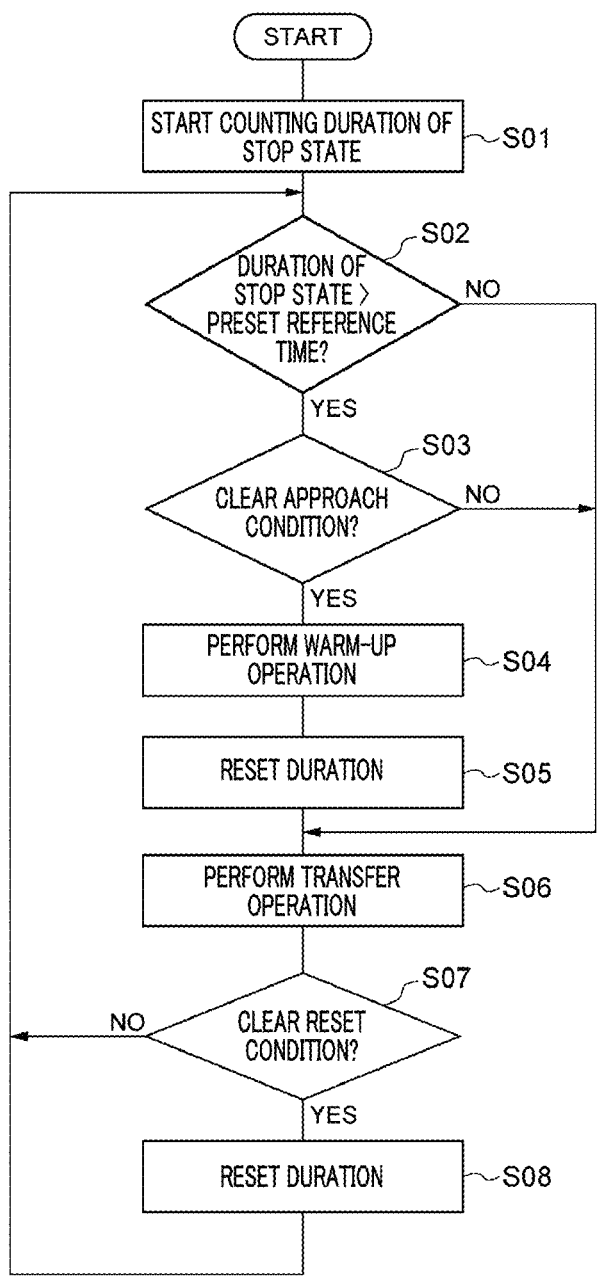
FIG. 11 is a flowchart illustrating an example of a transfer processing sequence.

As shown in FIG. 11, the control device 100 first performs a process 501. In the process 501, the operation status monitor 115 starts counting the duration of the stop state of the transfer device A3. For example, the operation status monitor 115 starts counting the duration when the coating and developing apparatus 2 is powered on and the processing of the wafer W is begun. Then, the counting of the duration by the operation status monitor 115 is continued.

Subsequently, the control device 100 performs a process S02. In the process S02, the necessity determination unit 116 checks whether the duration of the stop state of the transfer device A3 exceeds the preset reference time.

If it is determined in the process S02 that the duration of the stop state of the transfer device A3 exceeds the reference time, the control device 100 performs a process S03. In the process S03, the necessity determination unit 116 checks whether the approach level of the beginning of the high-accuracy transfer satisfies the approach condition.

If it is determined in the process S03 that the approach level of the beginning of the high-accuracy transfer satisfies the approach condition, the control device 100 performs a process S04. In the process S04, the warm-up controller 113 controls the transfer device A3 to perform the warm-up operation. Subsequently, the control device 100 performs a process S05. In the process S05, the operation status monitor 115 detects an end of the warm-up operation and resets the duration of the stop state of the transfer device A3.

Thereafter, the control device 100 perform a process S06. In the process S06, the normal transfer operation or the high-accuracy transfer operation is performed. If it is determined in the process S02 that the duration of the stop state of the transfer device A3 does not exceed the reference time, the control device 100 performs the process S06 without performing the process S04. If it is determined in the process S03 that the approach level of the beginning of the high-accuracy transfer does not meet the approach condition, the control device 100 performs the process S06 without performing the processes S04.

Then, the control device 100 performs a process S07. In the process S07, the reset processor 117 checks whether the transfer operation of the transfer device A3 performed in the process S06 satisfies the reset condition. This process S07 will be elaborated later.

If it is determined that the transfer operation of the transfer device A3 satisfies the reset condition, the control device 100 performs a process S08. In the process S08, the reset processor 117 resets the duration of the stop state of the transfer device A3. That is, in this case, it is determined that the continuation of the stop state of the transfer device A3 is ended. Meanwhile, if it is determined in the process S07 that the transfer operation of the transfer device A3 does not satisfy the reset condition, the duration of the stop state of the transfer device A3 is not reset. That is, in this case, it is determined that the stop state of the transfer device A3 is continued.

The control device 100 performs the transfer processing by performing the processes S02 to S08 repeatedly. By way of example, the control device 100 repeats the above-described transfer processing until a preset number of sheets of wafers W is completely processed in the coating and developing apparatus 2. For example, this transfer processing is performed throughout the course of production of the wafers W except maintenance of the coating and developing apparatus 2.

Figure 12:
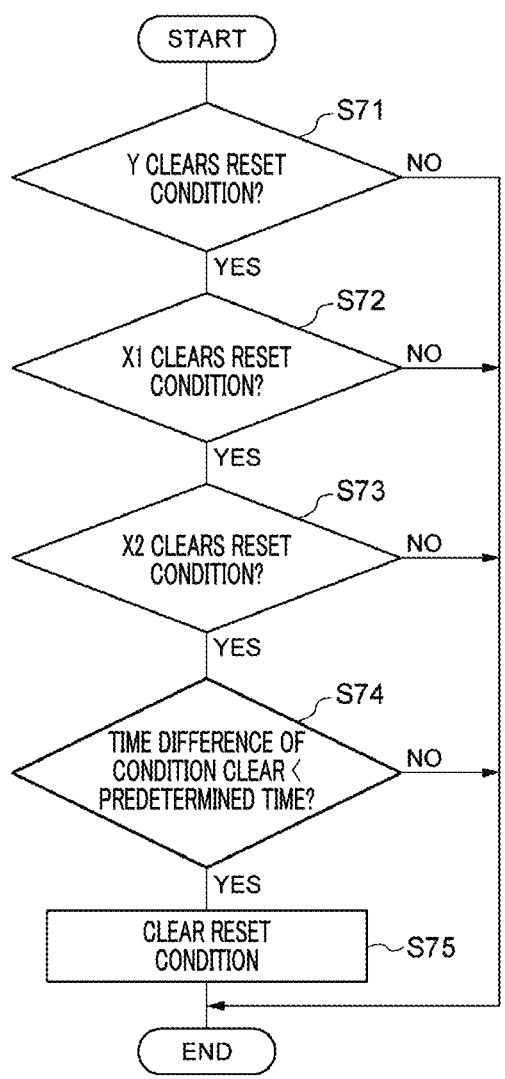
FIG. 12 is a flowchart illustrating an example of a reset condition determination sequence.

Now, an example of the process S07 will be explained. As shown in FIG. 12, the control device 100 first performs a process S71. In the process S71, the reset processor 117 checks whether the operation of the moving device 30 for movement in the Y-axis direction performed in the process S06 satisfies the reset condition (for example, the reset distance). If it is found out in the process S71 that the operation of the moving device 30 for movement does not satisfy the reset condition, the reset processor 117 makes the determination that the transfer operation of the transfer device A3 does not meet the reset condition, and terminates the process S07.

If it is determined in the process S71 that the operation of the moving device 30 for movement satisfies the reset condition, the control device 100 performs a process S72. In the process S72, the reset processor 117 checks whether the operation of the moving device 50A for access in the X-axis direction performed in the process S06 satisfies the reset condition (for example, the reset distance). If it is determined in the process S72 that the operation of the moving device 50A for access does not meet the reset condition, the reset processor 117 makes the determination that the transfer operation of the transfer device A3 does not satisfy the reset condition, and terminates the process S07.

If it is determined in the process S72 that the operation of the moving device 50A for access meets the reset condition, the control device 100 performs a process S73. In the process S73, the reset processor 117 checks whether the operation of the moving device 50B for access in the X-axis direction performed in the process S06 satisfies the reset condition (for example, the reset distance). If it is determined in the process S73 that the operation of the moving device 50B for access does not meet the reset condition, the reset processor 117 makes the determination that the transfer operation of the transfer device A3 does not satisfy the reset condition, and terminates the process S07.

If it is determined in the process S73 that the operation of the moving device 50B for access meets the reset condition, the control device 100 performs a process S74. In the process S74, the reset processor 117 checks whether the time difference (hereinafter, referred to as "clear time difference") between the time when the operation of the moving device 30 for movement satisfies the reset condition and the time when the operation of the moving device 50B for access satisfies the reset condition is smaller than a predetermined time. If it is found out that the clear time difference is equal to or larger than the predetermined time, the reset processor 117 makes the determination that the operation of the transfer device A3 does not satisfy the reset condition, and terminates the process S07.

If it is determined in the process S74 that the clear time difference is smaller than the predetermined time, the reset processor 117 makes the determination in the process S75 that the transfer operation of the transfer device A3 satisfies the reset condition, and terminates the process S07.

Figure 13:
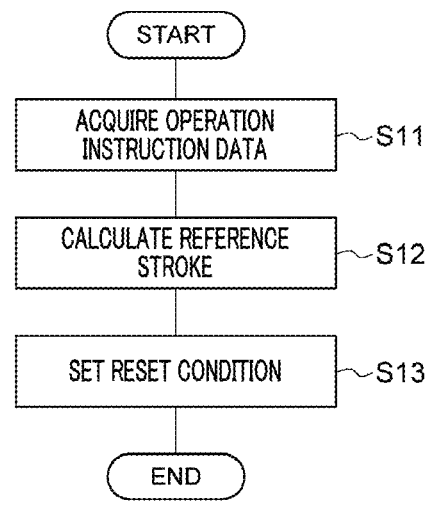
FIG. 13 is a flowchart illustrating an example of a reset condition setting sequence.

Besides the transfer processing, the control device 100 performs a setting processing of the reset condition. As depicted in FIG. 13, the control device 100 performs processes S11, S12 and S13. For example, the control device 100 performs the processes S11 to S13 before the transfer operation which is first performed based on the operation instruction stored in the operation instruction storage 111. In the process S11, the condition setting unit 119 acquires data upon the operation instruction from the operation instruction storage 111. Then, in the process S12, the condition setting unit 119 calculates the reference stroke of the moving device 30 for movement from the operation instruction data. For example, the condition setting unit 119 may calculate, as the reference stroke, the average of the operation strokes of the moving device 30 for movement or the maximum of the operation strokes of the moving device 30 for movement from the operational instruction data. Then, in the process S13, the reference stroke calculated by the condition setting unit 119 is set as the reset condition (reset distance). The reset condition set by the condition setting unit 119 is stored in the reset condition storage 118.

Effects of Exemplary Embodiments

The coating and developing apparatus 2 according to the present exemplary embodiment is equipped with the transfer device A3 configured to transfer the at least one wafer W as the processing target; the transfer controller 112 configured to control the transfer device A3 to perform the normal transfer of transferring the wafer W and the high-accuracy transfer of transferring the wafer W with higher positioning accuracy as compared to the normal transfer; the warm-up controller 113 configured to control the transfer device A3 to perform the warm-up operation, which is different from the normal transfer and the high-accuracy transfer, when necessary; and the necessity determination unit 116 configured to make the determination that the warm-up operation is required as the beginning of the high-accuracy transfer is approaching when the duration of the stop state of the transfer device A3 exceeds the preset reference time.

According to this coating and developing apparatus 2, if the stop state of the transfer device A3 is continued and the beginning of the high-accuracy transfer is approaching, the warm-up operation, which is different from the normal transfer and the high-accuracy transfer, is performed. Therefore, even if the stop state of the transfer device A3 is continued, the transfer device A3 can be stabilized through the warm-up operation. Furthermore, since the warm-up operation is performed when the beginning of the high-accuracy is approaching, the effect of the stabilization by the warm-up operation may be continued in the high-accuracy transfer. Thus, the coating and developing apparatus 2 is capable of improving the positioning accuracy for placing the wafer W at the processing position within the coating unit U1.

The necessity determination unit 116 makes the determination that the warm-up operation is required as the approach level of the beginning of the high-accuracy transfer satisfies the preset approach condition when the duration exceeds the preset reference time. That is, until the approach level of the beginning of the high-accuracy transfer satisfies the approach condition, the necessity determination unit 116 makes the determination that the warm-up operation is not required. In this case, since the warm-up operation is not performed until the approach level meets the approach condition, an unnecessary warm-up operation is suppressed. Therefore, improvement of the positioning accuracy and enhancement of the processing rate of wafers W per unit time can be both achieved.

The coating and developing apparatus 2 is further equipped with the reset processor 117 configured to reset the duration when the operation of the transfer device A3 satisfies the reset condition. Through the operation of the transfer device A3 such as satisfying the reset condition, the same stabilization effect as achieved by the warm-up operation can be achieved. Accordingly, the unnecessary warm-up operation is suppressed, and both the improvement of the positioning accuracy and the enhancement of the processing rate of wafers W per unit time can be achieved.

The transfer device A3 is equipped with the moving device 40 for rotation and the moving devices 50A and 50B for access. The reset processor 117 resets the duration when the operations of both the moving device 40 for rotation and the moving devices 50A and 50B for access satisfy the reset condition (for example, the reset distance) with the time difference within the preset time. In this case, an unnecessary reset of the duration by the reset processor 117 can be avoided, so that both the improvement of the positioning accuracy and the enhancement of the processing rate of wafers W per unit time can be achieved more securely.

The coating and developing apparatus 2 is further equipped with the condition setting unit 119 configured to set the reset condition based on the operation stroke of the transfer device A3 in the high-accuracy transfer at least. In this case, the unnecessary reset of the duration by the reset processor 117 can be avoided, so that both the improvement of the positioning accuracy and the enhancement of the processing rate of wafers W per unit time can be achieved more securely.

The coating and developing apparatus 2 is further equipped with the coating unit U1 and the heat treatment unit U2 configured to process the wafer W. The transfer device A3 is equipped with the arms 21 and 22 configured to hold the wafer W; the moving device 30 for movement configured to move the arms 21 and 22 along the first line 33 which passes at the outside of the coating unit U1 and the heat treatment unit U2; the moving devices 50A and 50B for access configured to move the arms 21 and 22 along the second line 52; and the moving device 40 for rotation configured to change the angle of the second line 52 with respect to the first line 33. The warm-up controller 113 operates the moving device 30 for movement, the moving device 40 for rotation and the moving devices 50A and 50B for access not to allow the arms 21 and 22 to enter the coating unit U1 and the heat treatment unit U2. In this case, the space (transfer chamber TR) outside the coating unit U1 and the heat treatment unit U2 in the coating and developing apparatus 2 can be effectively utilized. Therefore, more effective warm-up operation is enabled.

When carrying out the warm-up operation, the warm-up controller 113 operates the moving devices 50A and 50B for access (linear actuators 51) in the state that the second line 52 is made to follow the first line 33 by the moving device 40 for rotation. In this state, the warm-up operation with respect to the moving devices 50A and 50B for access can be more securely performed in the transfer chamber TR outside the coating unit U1 and the heat treatment unit U2.

So far, the exemplary embodiments have been described. However, the present disclosure is not limited to the above-described exemplary embodiments, and various changes and modifications may be made without departing form the scope of the present disclosure. By way of example, the substrate as the processing target is not limited to the semiconductor wafer, and a glass substrate, a mask substrate, a FPD (Flat Panel Display), and others may be used.

According to the exemplary embodiment, it is possible to provide the substrate processing apparatus capable of improving the positioning accuracy of the substrate onto the processing position.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
 a transfer device, which is disposed within a transfer chamber, configured to transfer at least one substrate as a processing target to a substrate processing unit located outside the transfer chamber;
 a transfer controller configured to control the transfer device to perform a normal transfer operation of transferring the substrate and a high-accuracy transfer operation of transferring the substrate with higher positioning accuracy as compared to the normal transfer;
a warm-up controller configured to control the transfer device to perform a warm-up operation, which is different from the normal transfer operation and the high-accuracy transfer operation, when necessary;
a necessity determination unit configured to make a determination that the warm-up operation is required when: a duration of a stop state of the transfer device exceeds a preset reference time, and a time until a beginning of the high-accuracy transfer operation is within a predetermined time or the transfer device has reached a start timing of a series of operations including the high-accuracy transfer operation, wherein the warm-up operation is performed within the transfer chamber without allowing the transfer device to enter the substrate processing unit;
a reset processor configured to reset the duration when an operation of the transfer device satisfies a reset condition;
multiple processing modules requiring the high-accuracy transfer operation for processing the substrate, and wherein the transfer device comprises multiple moving devices with different directions, the reset condition is set differently to correspond to each of the multiple processing modules based on a distance for the transfer device to transfer the substrate to each of the multiple processing modules, and the reset condition is set differently for each of the multiple moving devices of the transfer device.

2. The substrate processing apparatus of claim 1, wherein the necessity determination unit makes, when the duration exceeds the preset reference time, a determination that the warm-up operation is not performed until the current operation status of the transfer device satisfies a condition.

3. The substrate processing apparatus of claim 1, wherein the transfer device comprises at least two moving devices, and
the reset processor resets the duration when operations of the at least two moving devices satisfy the reset condition with a time difference within a preset time.

4. The substrate processing apparatus of claim 1, further comprising:
a condition setting unit configured to set the reset condition based on an operation stroke of the transfer device in the high-accuracy transfer.

5. The substrate processing apparatus of claim 1, further comprising:
at least one processing module configured to perform a processing on the substrate,
wherein the transfer device comprise:
an arm configured to hold the substrate;
a first moving device configured to move the arm along a first line which passes at an outside of the at least one processing module;
a second moving device configured to move the arm along a second line on which the arm accesses a target unit or retreats from the target unit, and to be moved by the first moving device along the first line with the arm; and
a third moving device configured to change an angle of the second line with respect to the first line by rotating the arm and the second moving device together, and to be moved by the first moving device along the first line with the arm, and the warm-up controller operates the first moving device, the second moving device and the third moving device not to cause the arm to enter the at least one processing module when the warm-up operation is performed.

6. The substrate processing apparatus of claim 5, wherein when carrying out the warm-up operation, the warm-up controller operates the second moving device in a state that the second line is made to follow the first line by the third moving device.

7. The substrate processing apparatus of claim 1, wherein the transfer device includes a timing belt, and
the necessity determination unit determines to perform the warm-up operation to change an extension characteristic of the timing belt to be converged on a preset condition.

8. The substrate processing apparatus of claim 1, further comprising:
a processing module configured to perform a processing on an edge portion of the substrate placed at a processing position of the processing module,
wherein the high-accuracy transfer is performed when transferring the substrate into the processing module and placing the substrate at the processing position with higher positioning accuracy to perform the processing on the edge portion of the substrate.

9. The substrate processing apparatus of claim 1, wherein the necessity determination unit is further configured to:
perform the warm-up operation at a later time and not at the timing of the determination.

10. A substrate processing method, comprising:
controlling a transfer device, which is disposed within a transfer chamber, to perform a normal transfer operation of transferring at least one substrate as a processing target to a substrate processing unit located outside the transfer chamber and a high-accuracy transfer operation of transferring the substrate with higher positioning accuracy as compared to the normal transfer;
controlling the transfer device to perform a warm-up operation, which is different from the normal transfer operation and the high-accuracy transfer operation, within the transfer chamber without allowing the transfer device to enter the substrate processing unit when necessary;
making a determination that the warm-up operation is required when: a duration of a stop state of the transfer device exceeds a preset reference time, and a time until a beginning of the high-accuracy transfer operation is within a predetermined time or the transfer device has reached a start timing of a series of operations including the high-accuracy transfer operation;
resetting the duration when an operation of the transfer device satisfies a reset condition;
wherein multiple processing modules require the high-accuracy transfer operation for processing the substrate, and wherein the transfer device comprises multiple moving devices with different directions, the reset condition is set differently to correspond to each of the multiple processing modules based on a distance for the transfer device to transfer the substrate to each of the multiple processing modules, and the reset condition is set differently for each of the multiple moving devices of the transfer device.

11. A non-transitory computer-readable recording medium having stored thereon computer-executable instructions that, in response to execution, cause an apparatus to perform a substrate processing method as claimed in claim 10.

12. A substrate processing apparatus, comprising:
- a transfer device, which is disposed within a transfer chamber, configured to transfer at least one substrate as a processing target to a substrate processing unit located outside the transfer chamber;
- a transfer controller configured to control the transfer device to perform a normal transfer operation of transferring the substrate and a high-accuracy transfer operation of transferring the substrate with higher positioning accuracy as compared to the normal transfer;
- a warm-up controller configured to control the transfer device to perform a warm-up operation, which is different from the normal transfer operation and the high-accuracy transfer operation, when necessary;
- a necessity determination unit configured to make a determination that the warm-up operation is required when: a duration of a stop state of the transfer device exceeds a preset reference time, and a time until a beginning of the high-accuracy transfer operation is within a predetermined time or the transfer device has reached a start timing of a series of operations including the high-accuracy transfer operation, wherein the warm-up operation is performed within the transfer chamber without allowing the transfer device to enter the substrate processing unit;
- a reset processor configured to reset the duration when an operation of the transfer device satisfies a reset condition;
- multiple processing modules requiring the high-accuracy transfer operation for processing the substrate, and wherein the transfer device comprises multiple moving devices with different directions, the reset condition is set differently to correspond to each of the multiple processing modules based on a distance for the transfer device to transfer the substrate to each of the multiple processing modules, and the reset condition is set differently for each of the multiple moving devices of the transfer device.

13. The substrate processing apparatus of claim 12, wherein the predetermined time until a beginning of the high-accuracy transfer is reached when the transfer device reaches a predetermined position in the substrate processing apparatus.

\* \* \* \* \*